(12) United States Patent
Morimoto et al.

(10) Patent No.: US 6,509,648 B1
(45) Date of Patent: Jan. 21, 2003

(54) METHOD OF MANUFACTURING SEMICONDUCTOR DEVICE AND SEMICONDUCTOR DEVICE

(75) Inventors: Noboru Morimoto, Tokyo (JP); Masazumi Matsuura, Tokyo (JP); Kinya Goto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 112 days.

(21) Appl. No.: 09/691,030

(22) Filed: Oct. 19, 2000

(30) Foreign Application Priority Data

Apr. 3, 2000 (JP) .......................................... 2000-100483

(51) Int. Cl.[7] .............................................. H01L 21/44
(52) U.S. Cl. ...................... 257/751; 438/618; 438/624; 438/625; 438/626; 438/631; 438/783; 438/253; 438/279; 257/751; 257/759; 257/755; 257/760; 257/752; 257/758
(58) Field of Search ................................ 438/598, 618, 438/624, 625, 626, 631, 633, 634, 637, 629, 783, 253, 279, 286, 303, 254, 759, 751–755, 382, 760, 752, 758

(56) References Cited

U.S. PATENT DOCUMENTS

| | | | | | |
|---|---|---|---|---|---|
| 5,534,731 A | * | 7/1996 | Cheung | ........................ | 257/759 |
| 5,637,924 A | * | 6/1997 | Hibino | ........................ | 257/751 |
| 5,689,140 A | * | 11/1997 | Shoda | ........................ | 257/751 |
| 5,705,849 A | * | 1/1998 | Zheng et al. | ................... | 257/50 |
| 5,907,772 A | * | 5/1999 | Iwasaki | ........................ | 438/253 |
| 6,020,242 A | * | 2/2000 | Tsai et al. | ..................... | 438/279 |
| 6,028,013 A | * | 2/2000 | Annapragada et al. | ....... | 438/783 |
| 6,028,362 A | * | 2/2000 | Omura | ......................... | 257/751 |
| 6,162,678 A | * | 12/2000 | Lin et al. | ..................... | 438/253 |
| 6,214,126 B1 | * | 4/2001 | Miyoshi et al. | ................. | 134/2 |

FOREIGN PATENT DOCUMENTS

JP 10-326829 12/1998

OTHER PUBLICATIONS

U.S. patent application Ser. No. 09/785,248, filed Feb. 20, 2001, pending.
U.S. patent application Ser. No. 09/691,030, filed Oct. 19, 2000, pending.

* cited by examiner

*Primary Examiner*—Matthew Smith
*Assistant Examiner*—V. Yevsikov
(74) *Attorney, Agent, or Firm*—Oblon, Spivak, McClelland, Maier & Neustadt, P.C.

(57) ABSTRACT

A method of manufacturing a semiconductor device is obtained which is capable of evading generation of a short circuit between wirings in an upper wiring layer even if a part of an upper surface of an FSG film is exposed by variations in a production step. After a USG film (4) is deposited to a thickness of 1 Hm over an entire surface of an FSG film (3), the USG film (4) is polished and removed by a thickness of 900 nm from an upper surface thereof by the CMP method. At this time, part of an upper surface of the FSG film (3) is exposed by variations in a production step. Next, the surface of the interlayer dielectric film (50) is cleaned with a cleaning liquid whose etching rate to the FSG film (3) and etching rate to the USG film (5) are substantially the same. Such a cleaning liquid may be, for example, an ammonia hydrogen peroxide mixture of $NH_4OH:H_2O_2:H_2O=1:1:20$. The structure shown in FIG. 5 is dipped in the above-mentioned ammonia hydrogen peroxide mixture for 60 seconds to clean the surface of the interlayer dielectric film (50).

6 Claims, 10 Drawing Sheets

F I G . 1
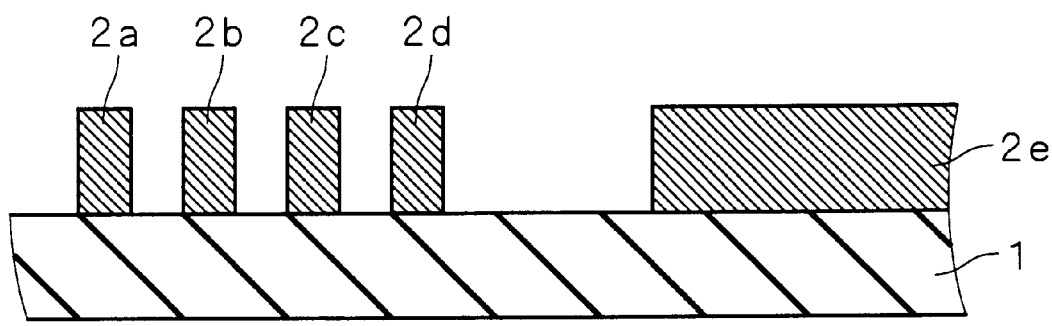
F I G . 2
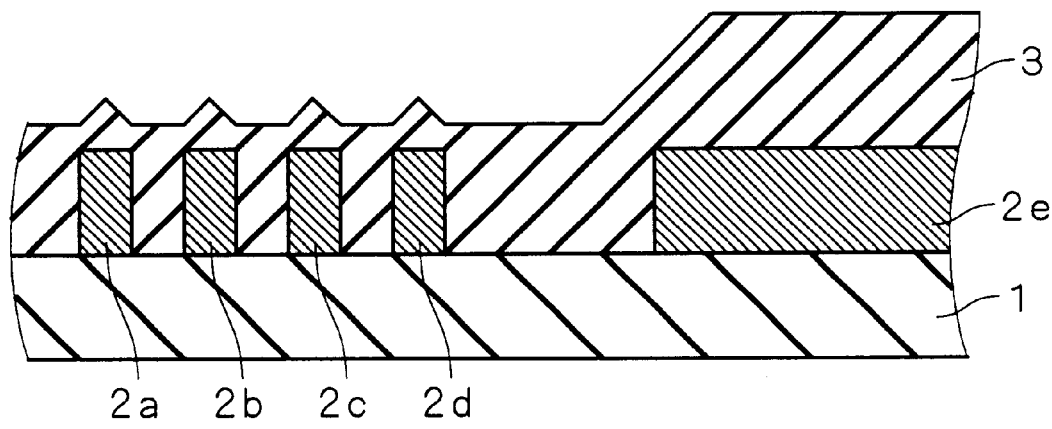

METHOD OF MANUFACTURING SEMICONDUCTOR DEVICE AND SEMICONDUCTOR DEVICE

BACKGROUND OF THE INVENTION

1. Field of the Invention

The present invention relates to a method of manufacturing a semiconductor device, and more particularly to a method of forming a multi-layered wiring structure, and further to a semiconductor device manufactured by the above-mentioned method of manufacturing a semiconductor device.

2. Description of the Background Art

Regarding semiconductor integrated circuits, higher speed, higher performance, and miniaturization of devices are being promoted along with generations, and in particular, signal propagation delays constitute a critical problem in accordance with the miniaturization. The signal propagation delays are classified into gate delay components and wiring delay components. The gate delays tend to decrease in accordance with the miniaturization of transistors, whereas the wiring delays tend to increase in accordance with the miniaturization of the wirings. The wiring delays are determined by the product CR of wiring capacitance C and wiring resistance R. Therefore, reduction of the wiring capacitance C by lowering the electric permittivity of a wiring interlayer dielectric film is now being considered as a measure for restraining the wiring delays. One of such measures is directed to reduction of capacitance by use of a silicon oxide film containing fluorine (F-doped silicate glass, hereafter referred to as FSG film in this specification) as the wiring interlayer dielectric film.

FIGS. 9 to 13 are cross section views illustrating steps in a method of manufacturing a semiconductor device according to a background art. First, a plurality of wirings 102a to 102e are formed as a first wiring layer on an upper surface of an underlying dielectric film 101 (FIG. 9). Next, an FSG film 103 is formed on the structure shown in FIG. 9 (FIG. 10). Then, a silicon oxide film 104 containing no fluorine (undoped silicate glass, hereafter referred to as USG film in this specification) is formed on the structure shown in FIG. 10 (FIG. 11). Next, the USG film 104 is polished and removed by a predetermined thickness from an upper surface thereof by the CMP method to flatten the surface of the USG film 104. This completes an interlayer dielectric film 150a made of the FSG film 103 and a USG film 105 (FIG. 12). Then, after the surface of the interlayer dielectric film 150a is cleaned with HF, a plurality of contact holes 106a to 106e, which are respectively in contact with the wirings 102a to 102e and each filled with a conductor plug, are formed in the interlayer dielectric film 150a. Then, after a metal film is formed over an entire surface of the interlayer dielectric film 150a, the metal film is patterned by the photolithography method and the anisotropic dry etching method to form a plurality of wirings 107a to 107e, which are respectively in contact with the contact holes 106a to 106e, as a second wiring layer (FIG. 13).

However, from the viewpoint of reduction in the wiring capacitance, it is effective to increase the ratio occupied by the FSG film 103 in the interlayer dielectric film 150a by increasing the thickness of the FSG film 103.

FIGS. 14 to 17 are cross section views showing steps in a method of manufacturing another semiconductor device according to a background art. First, on the structure shown in FIG. 1, an FSG film 108 is formed to a thickness larger than the thickness of the wirings 102a to 102e (FIG. 14). Next, on the FSG film 108, a USG film 101 is formed to a thickness larger than the thickness of the FSG film 108 (FIG. 15). Then, the USG film 101 is polished and removed by a predetermined thickness from an upper surface thereof by the CMP method to flatten the surface of the USG film 101 to such an extent that the FSG film 108 is not exposed. This completes an interlayer dielectric film 150b made of the FSG film 108 and a USG film 110 (FIG. 16). Then, after the surface of the interlayer dielectric film 150b is cleaned with HF, contact holes 106a to 106e and wirings 107a to 107e are formed in the same manner as described above (FIG. 17).

However, according to the conventional method of manufacturing a semiconductor device shown in FIGS. 14 to 17, a part of the upper surface of the FSG film 108 will be exposed by the CMP process of the USG film 109 if variations occur in the thickness of the USG film 109 formed on the FSG film 108 or in the amount of the USG film 109 polished in the CMP step.

Therefore, in the subsequent cleaning step, a step difference is created on the upper surface of the interlayer dielectric film 150b due to the difference in the etching rate of HF between the FSG film and the USG film (for example, if a 1% diluted HF is used, the etching rate of the FSG film is 40 nm/min while the etching rate of the USG film is 20 nm/min). FIG. 18 is a cross section view showing such a step difference. The upper surface of the FSG film 108 is at a level lower than the upper surface of the USG film 110 to form a step difference 111 at a boundary part.

If the wirings 107a to 107e are formed on the interlayer dielectric film 150b by the above-mentioned method under such a circumstance where the step difference 111 has been created, a metal side wall is formed along the step difference 111. FIGS. 19 and 20 are a cross section view and a top view showing such a side wall. A metal side wall 112 is formed along the step difference 111. Referring to FIG. 20, a wiring 107e2 is formed in parallel with a wiring 107e1 in an FSG-exposed region where the upper surface of the FSG film 108 is exposed. The wiring 107e1 and the wiring 107e2 are electrically connected with each other via the metal side wall 112. In other words, a short circuit occurs between the wirings in the upper layer, i.e. the second wiring layer.

Also, in the case where the wirings 107a to 107e are to be formed as buried wirings, that is, to be more specifically described, in the case where the steps of (a) depositing a dielectric film over an entire surface of the structure shown in FIG. 18, (b) removing the dielectric film to form a recess in a region where the wirings 107a to 107e are to be formed, (c) depositing a metal film over an entire surface to a thickness larger than the thickness that fills the recess, and (d) performing the CMP until the dielectric film is exposed, are performed in this order to form the wirings 107a to 107e buried in the recess, a part of the metal film remains on the dielectric film between the wiring 107e1 and the wiring 107e2 to generate a short circuit between the wiring 107e1 and the wiring 107e2.

Thus, the conventional method of manufacturing a semiconductor device involves a problem such that, in the case where a part of the upper surface of the FSG film constituting the interlayer dielectric film is exposed due to variations in a production step, a step difference occurs on the upper surface of the interlayer dielectric film in a later cleaning step, leading to a short circuit between the wirings in the upper wiring layer.

SUMMARY OF THE INVENTION

According to a first aspect of the present invention, a method of manufacturing a semiconductor device includes the steps of (a) forming a first layer wiring on an underlying layer; (b) forming a first dielectric film on a structure obtained by the step (a); (c) forming a second dielectric film on the first dielectric film, the second dielectric film being made of a different material from the first dielectric film; (d) reducing a thickness of the second dielectric film by a predetermined thickness from a surface thereof to form an interlayer dielectric film made of the first dielectric film and the second dielectric film having a reduced thickness; (e) cleaning the surface of the interlayer dielectric film with a cleaning liquid whose etching rate to the first dielectric film and etching rate to the second dielectric film are substantially the same; and (f) forming a second layer wiring on the surface of the interlayer dielectric film.

According to a second aspect of the present invention, a method of manufacturing a semiconductor device described in the first aspect is characterized in that the first dielectric film is a dielectric film made of a material having a lower electric permittivity than the second dielectric film, and that the second dielectric film is a dielectric film made of a material having a lower moisture absorptivity than the first dielectric film.

According to a third aspect of the present invention, a method of manufacturing a semiconductor device described in the first or second aspect is characterized in that the first dielectric film is a silicon oxide film containing fluorine, the second dielectric film is a silicon oxide film containing no fluorine, and the cleaning liquid is any one of ammonia hydrogen peroxide mixture, TMAH (tetramethylammonium hydride), and EDTA (ethylenediaminetetraacetic acid).

According to a fourth aspect of the present invention, a method of manufacturing a semiconductor device described in any one of the first to third aspects is characterized by further including the step of (g) performing a heat treatment for eliminating moisture contained in the first dielectric film, the step (g) being carried out between the step (e) and the step (f).

According to a fifth aspect of the present invention, a method of manufacturing a semiconductor device described in any one of the first to third aspects is characterized by further including the step of (h) forming a third dielectric film on the surface of the interlayer dielectric film, the third dielectric film being made of a material having a lower moisture absorptivity than the first dielectric film, the step (h) being carried out between the step (e) and the step (f).

According to a sixth aspect of the present invention, a method of manufacturing a semiconductor device described in the fifth aspect is characterized by further including the step of (i) performing a heat treatment for eliminating moisture contained in the first dielectric film, the step (i) being carried out between the step (e) and the step (h).

According to a seventh aspect of the present invention, a semiconductor device is produced by a method described in any one of the first to sixth aspects.

According to the first aspect of the present invention, even if a part of the upper surface of the first dielectric film is exposed in the upper surface of the interlayer dielectric film in the step (d) due to the variations in the production step, there will be no step difference on the upper surface of the interlayer dielectric film by cleaning because the cleaning is carried out in the step (e) with the use of a cleaning liquid whose etching rate to the first dielectric film and etching rate to the second dielectric film are substantially the same. Therefore, the generation of short circuits between the second layer wirings, which is brought about by the electrically conductive sidewalls formed along the step difference, can be evaded.

According to the second aspect of the present invention, the reduction of wiring capacitance by lowering the electric permittivity of the interlayer dielectric film is compatible with the evasion of decrease in the close adhesion between the interlayer dielectric film and the second layer wiring, which is brought about by the high moisture absorptivity of the first dielectric film.

According to the third aspect of the present invention, since the etching rate of ammonia hydrogen peroxide mixture or the like to the silicon oxide film containing fluorine is substantially the same as the etching rate of ammonia hydrogen peroxide mixture or the like to the silicon oxide film containing no fluorine, there will be no step difference on the upper surface of the interlayer dielectric film by surface cleaning of the interlayer dielectric film using ammonia hydrogen peroxide mixture or the like.

According to the fourth aspect of the present invention, even if a part of the upper surface of the first dielectric film is exposed in the upper surface of the interlayer dielectric film due to the variations in the production step, the close adhesion between the interlayer dielectric film and the second layer wiring can be enhanced because the moisture absorbed by the first dielectric film in the previous steps is eliminated by the heat treatment.

According to the fifth aspect of the present invention, even if a part of the upper surface of the first dielectric film is exposed in the upper surface of the interlayer dielectric film due to the variations in the production step, decrease in the close adhesion of the second layer wiring can be evaded because the exposed upper surface of the first dielectric film is covered with the third dielectric film, and the second layer wiring is formed on the third dielectric film.

According to the sixth aspect of the present invention, even if a part of the upper surface of the first dielectric film is exposed in the upper surface of the interlayer dielectric film due to the variations in the production step, the close adhesion between the second layer wiring and the third dielectric film can be further enhanced because the moisture absorbed by the first dielectric film in the previous steps is eliminated by the heat treatment.

According to the seventh aspect of the present invention, a semiconductor device can be provided that can achieve evasion of short circuits between wirings in the second layer wiring, evasion of decrease in the close adhesion between the second layer wiring and the interlayer dielectric film, and reduction of the wiring capacitance by lowering the electric permittivity of the interlayer dielectric film.

It is therefore an object of the present invention to provide a method of manufacturing a semiconductor device which is capable of evading generation of a short circuit between wirings in an upper wiring layer even if a part of an upper surface of an FSG film is exposed by variations in a production step, and a semiconductor device manufactured by the above-mentioned method.

These and other objects, features, aspects, and advantages of the present invention will become more apparent from the following detailed description of the present invention when taken in conjunction with the accompanying drawings.

BRIEF DESCRIPTION OF THE DRAWINGS

FIGS. 1 to 6 are cross section views illustrating steps in a method of manufacturing a semiconductor device according to a first preferred embodiment of the present invention;

DESCRIPTION OF THE PREFERRED EMBODIMENTS

First Preferred Embodiment

FIGS. 1 to 6 are cross section views illustrating steps in a method of manufacturing a semiconductor device according to a first preferred embodiment of the present invention. Hereafter, the method of manufacturing a semiconductor device according to the first preferred embodiment will be described assuming that the thickness of the lower first wiring layer is set to be 500 nm, and the intended thickness of the interlayer dielectric film between the first wiring layer and the upper second wiring layer is set to be 700 nm.

First, a metal film such as an Al-based alloy is formed to a thickness of 500 nm on an upper surface of an underlying dielectric film 1 by the sputtering method or the like. Next, a photoresist having a predetermined opening pattern is formed on the metal film by the photolithography method. Then, with the use of the formed photoresist as an etching mask, the metal film is etched by the reactive ion etching method until the upper surface of the underlying dielectric film 1 is exposed. Thereafter, the photoresist is removed, thereby to form a plurality of wirings 2a to 2e as the first wiring layer on the upper surface of the underlying dielectric film 1 (FIG. 1).

Then, an FSG film 3 is formed to a thickness of 600 nm over the entire surface by the HDP(high density plasma)-CVD method or the like (FIG. 2). By forming the FSG film 3 to a thickness larger than the thickness of the wirings 2a to 2e, the spaces between the adjacent wirings 2a to 2e can be completely filled with the FSG film 3, thereby reducing the wiring capacitance generated between the adjacent wirings. Here, in FIG. 2, the reason why the thickness of the FSG film 3 on the wiring 2e is larger than the thickness of the FSG film 3 on the wirings 2a to 2d is that, because the wiring 2e has a wider upper area than the wirings 2a to 2d, the FSG film 3 is deposited on the wiring 2e to the same thickness (i.e. 600 nm) as the formed film.

Figure 3:
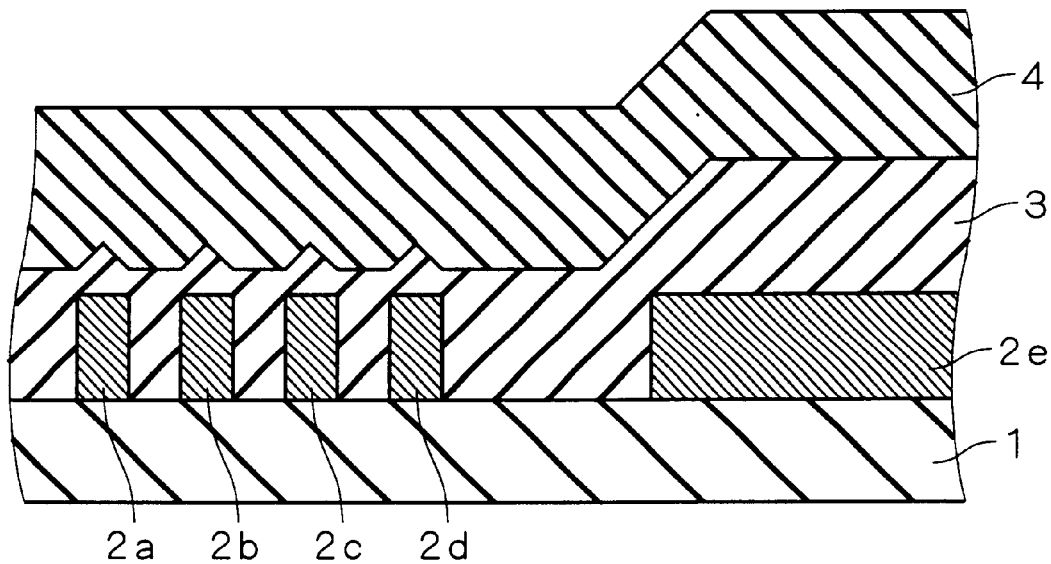
Figure 4:
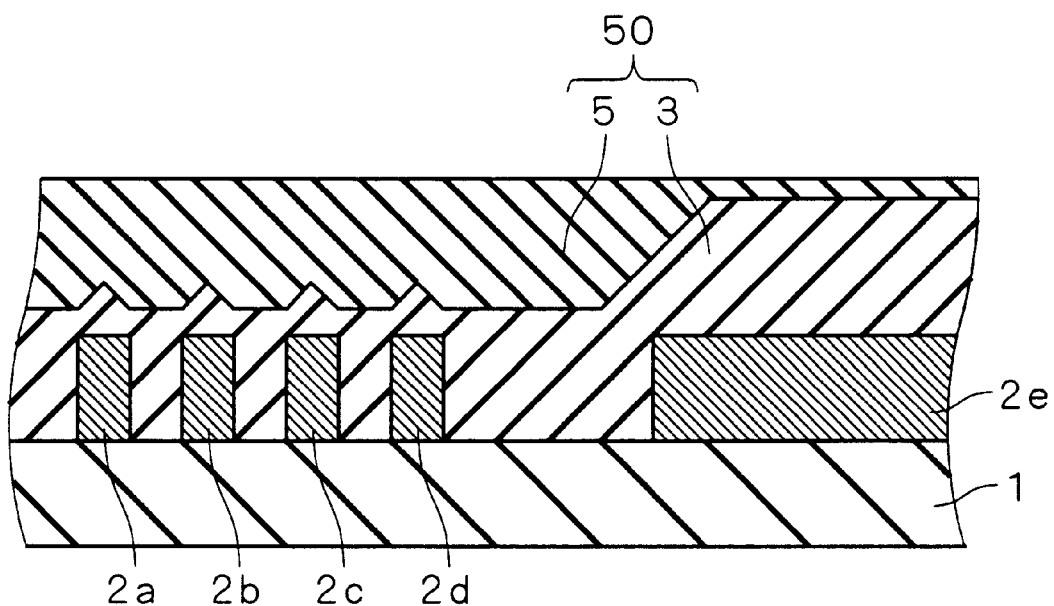

Next, a USG film 4 is deposited to a thickness of 1 μm over the entire surface of the FSG film 3 by the CVD method or the like (FIG. 3). Then, the thickness of the USG film 4 is reduced by a thickness of 900 nm from an upper surface thereof by polishing and removing the USG film 4 by the CMP method, thereby to flatten the surface. This completes an interlayer dielectric film 50 made of the FSG film 3 and a USG film 5 (FIG. 4). At this time, if the structure obtained after the CMP step has been finished as designed, the USG film 5 should remain by a thickness of 100 nm on the FSG film 3 above the wiring 2e. Generally, the FSG film has a property of having a lower electric permittivity and a higher moisture absorptivity than the USG film. As illustrated in FIG. 4, by covering the upper surface of the FSG film 3 with the USG film 5, it is possible to evade a problem of decrease in the close adhesion between the interlayer dielectric film 50 and the second wiring layer formed on the interlayer dielectric film 50 in a later step, which decrease is brought about by the moisture absorbed by the FSG film 3. On the other hand, the wiring capacitance generated between the first wiring layer and the second wiring layer can be reduced by increasing the ratio occupied by the FSG film 3 in the interlayer dielectric film 50. From such a viewpoint, it is desired to polish and remove the USG film 4 as much as possible in the CMP step.

Figure 5:
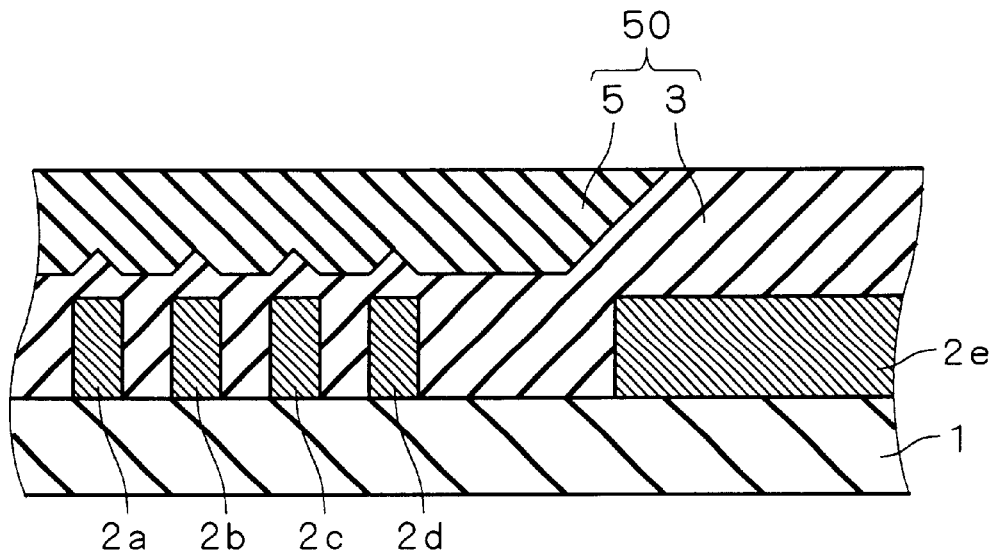

Thus, the CMP step of the USG film 4 is carried out in an attempt to polish and remove the USG film 4 as much as possible but to an extent such that the upper surface of the FSG film 3 will not be exposed. However, if variations occur in the thickness of the USG film 4 formed on the FSG film 3 or in the amount of the USG film 4 polished in the CMP step, a part of the upper surface of the FSG film 3 will be exposed by the CMP step of the USG film 4 (FIG. 5). Hereafter, an explanation will be given assuming that the circumstance illustrated in FIG. 5 has occurred.

After the structure illustrated in FIG. 5 is obtained, the surface of the interlayer dielectric film 50 is cleaned with the use of a cleaning liquid whose etching rate to the FSG film 3 and etching rate to the USG film 5 are substantially the same. This step can be regarded as a part of the CMP step; however, the description is given by regarding this cleaning step as being different from the CMP step. Such a cleaning liquid may be, for example, an ammonia hydrogen peroxide mixture of $NH_4OH:H_2O_2:H_2O=1:1:20$, TMAH (tetramethylammonium hydride), or EDTA (ethylenediaminetetraacetic acid). The surface of the interlayer dielectric film 50 is cleaned by dipping the structure illustrated in FIG. 5 into the aforementioned ammonia hydrogen peroxide mixture for 60 seconds. The interlayer dielectric film 50 is hardly etched because the etching rates of the above-mentioned ammonia hydrogen peroxide mixture on the FSG film and the USG film are both no greater than 1 nm/min.

Figure 6:
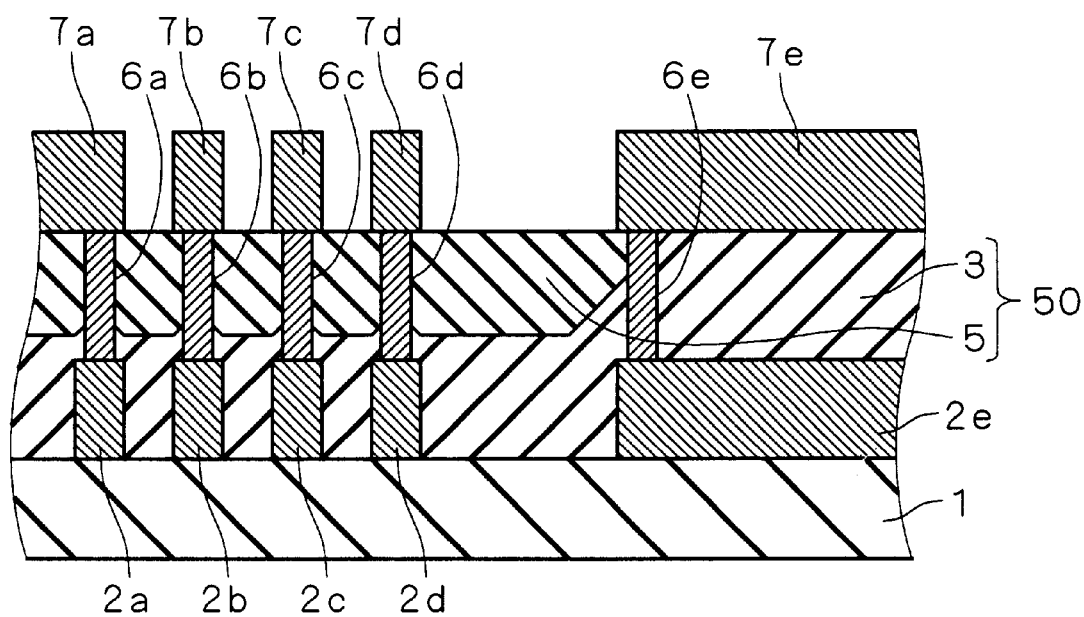

Next, a plurality of contact holes 6a to 6e, which are respectively in contact with the wirings 2a to 2e and filled with a conductor plug, are formed in the interlayer dielectric film 50. Then, after a metal film is formed over the entire surface of the interlayer dielectric film 50, the metal film is patterned by the photolithography method and the anisotropic dry etching method to form a plurality of wirings 7a to 7e, which are respectively in contact with the contact holes 6a to 6e, as a second wiring layer (FIG. 6).

Thus, for manufacturing a semiconductor device according to the first preferred embodiment of the present invention, the surface of the interlayer dielectric film 50 is cleaned with the use of a cleaning liquid whose etching rate to the FSG film 3 and etching rate to the USG film 5 are substantially the same after the USG film 4 is polished and removed by a predetermined thickness by the CMP method. Therefore, even if a part of the upper surface of the FSG film 3 is exposed by variations in a production step, there will be no step difference 111 generated on the surface of the interlayer dielectric film 50, such as in the conventional method of manufacturing a semiconductor device. As a result, it is possible to evade generation of short circuits between the wirings caused by the metal side walls 112 that are formed along the step difference 111. Furthermore, the generation of short circuits between the wirings can be evaded even if the wirings 7a to 7e are formed as buried wirings.

Second Preferred Embodiment

Figure 7:
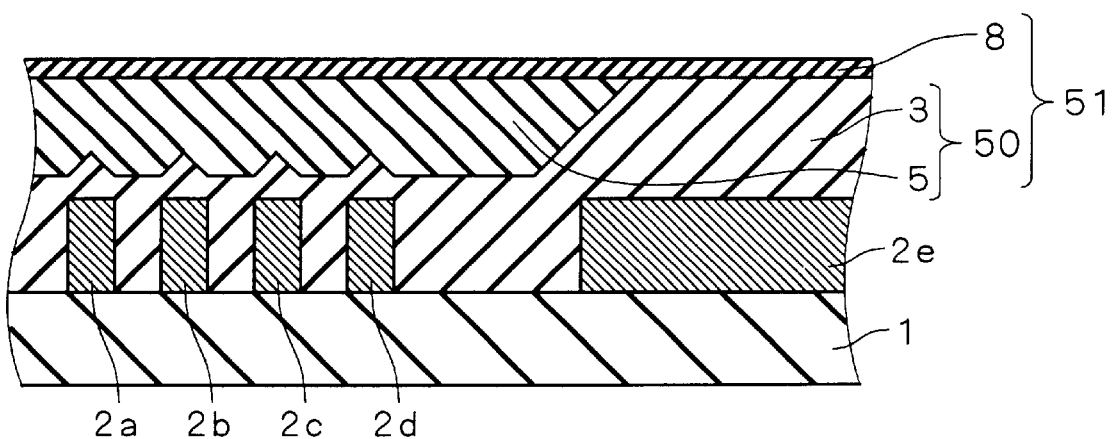
FIGS. 7 and 8 are cross section views illustrating steps in a method of manufacturing a semiconductor device according to a second preferred embodiment of the present invention.
Figure 8:
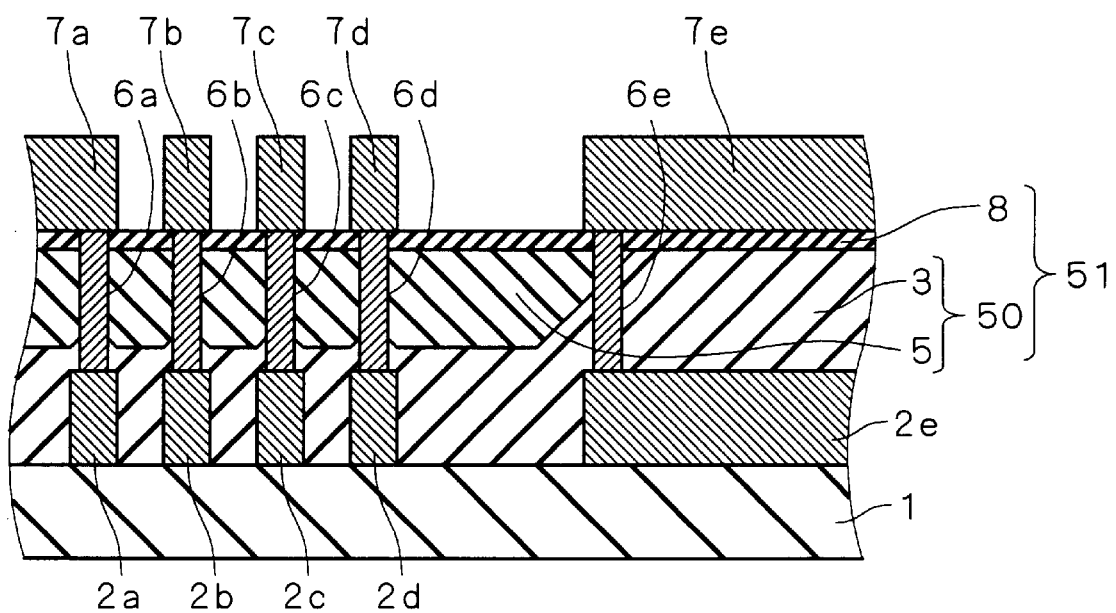
Figure 9:
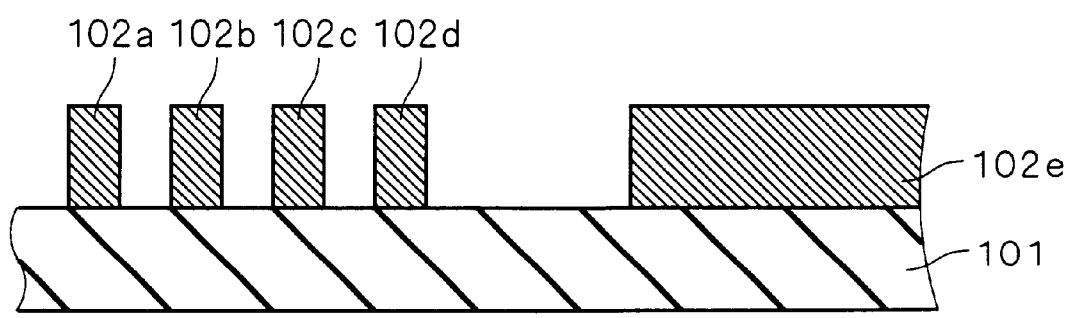
FIGS. 9 to 13 are cross section views illustrating steps in a method of manufacturing a semiconductor device according to a background art.
Figure 10:
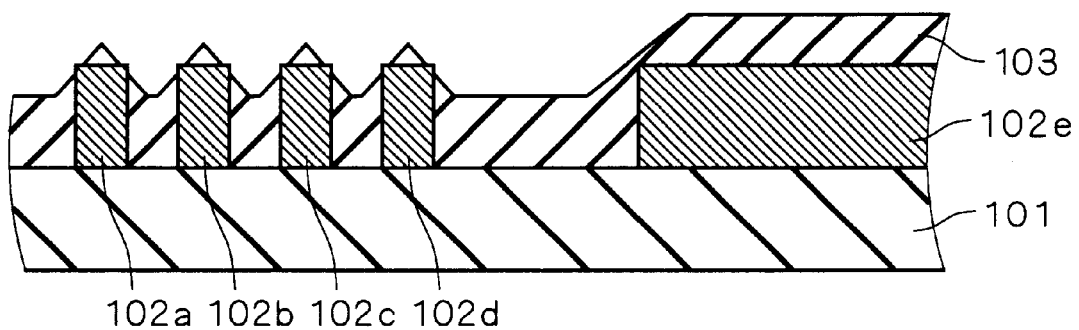
Figure 11:
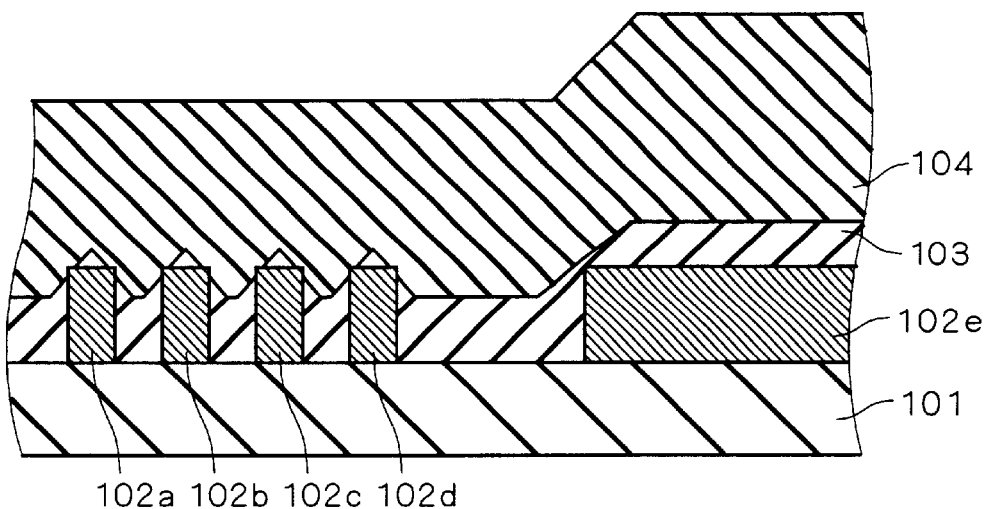
Figure 12:
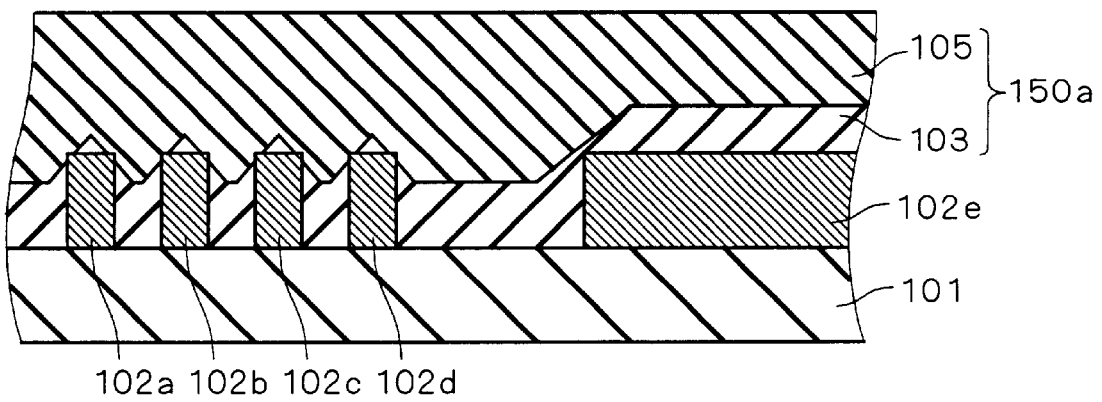
Figure 13:
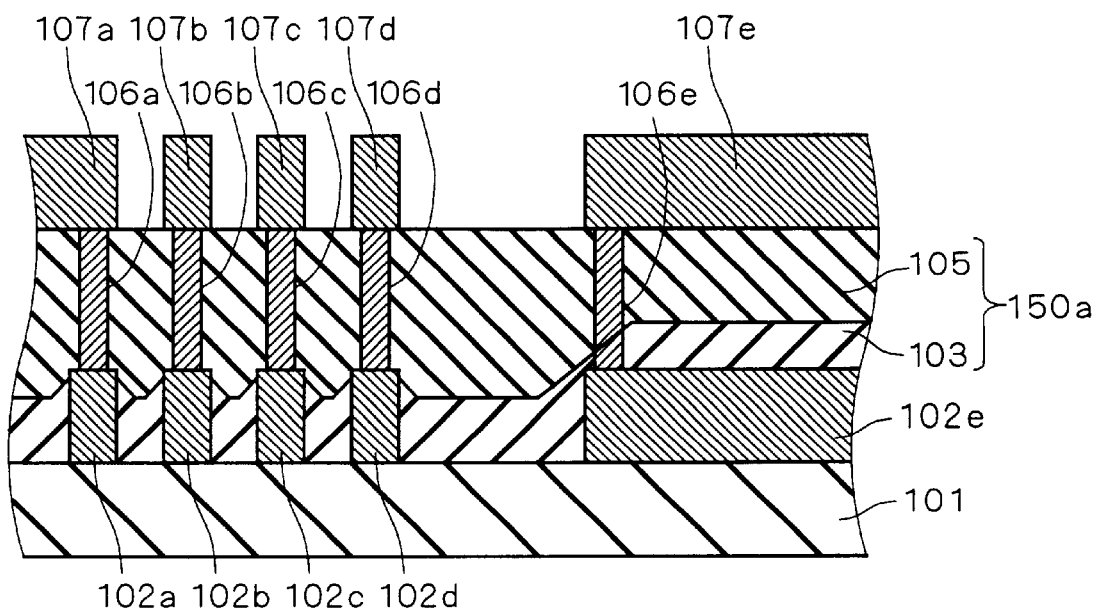
Figure 14:
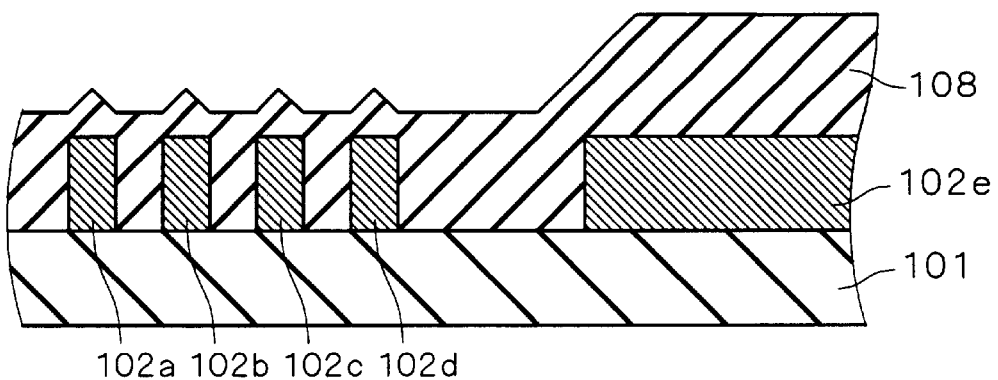
FIGS. 14 to 17 are cross section views illustrating steps in a method of manufacturing another semiconductor device according to a background art.
Figure 15:
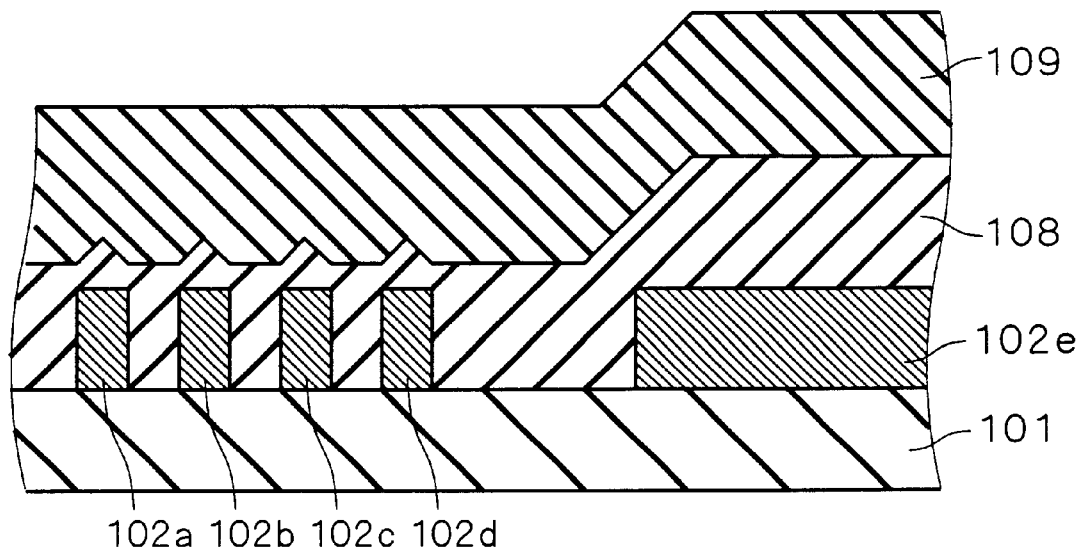
Figure 16:
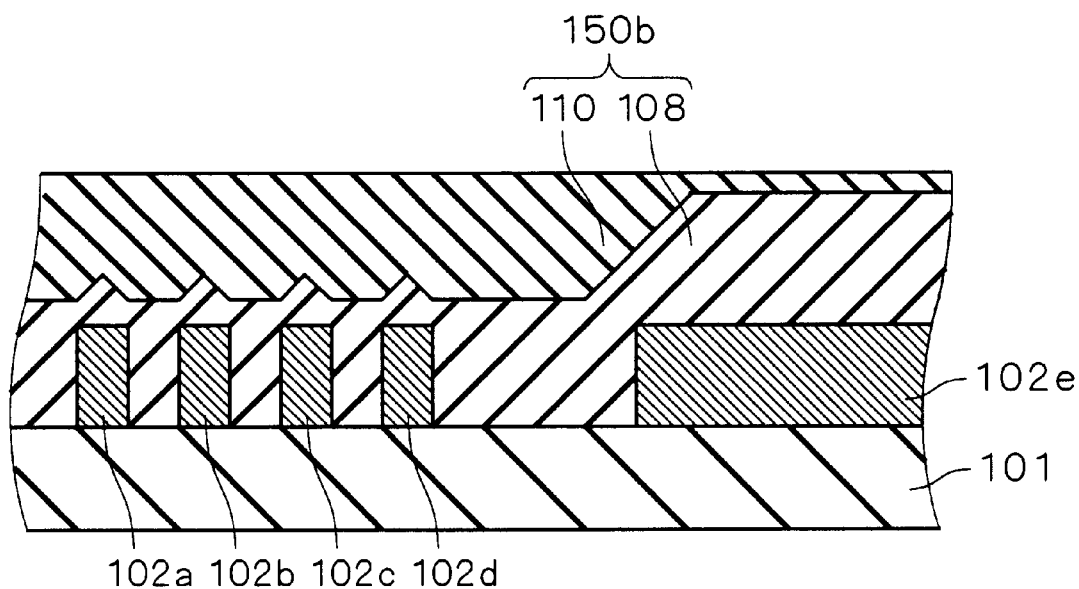
Figure 17:
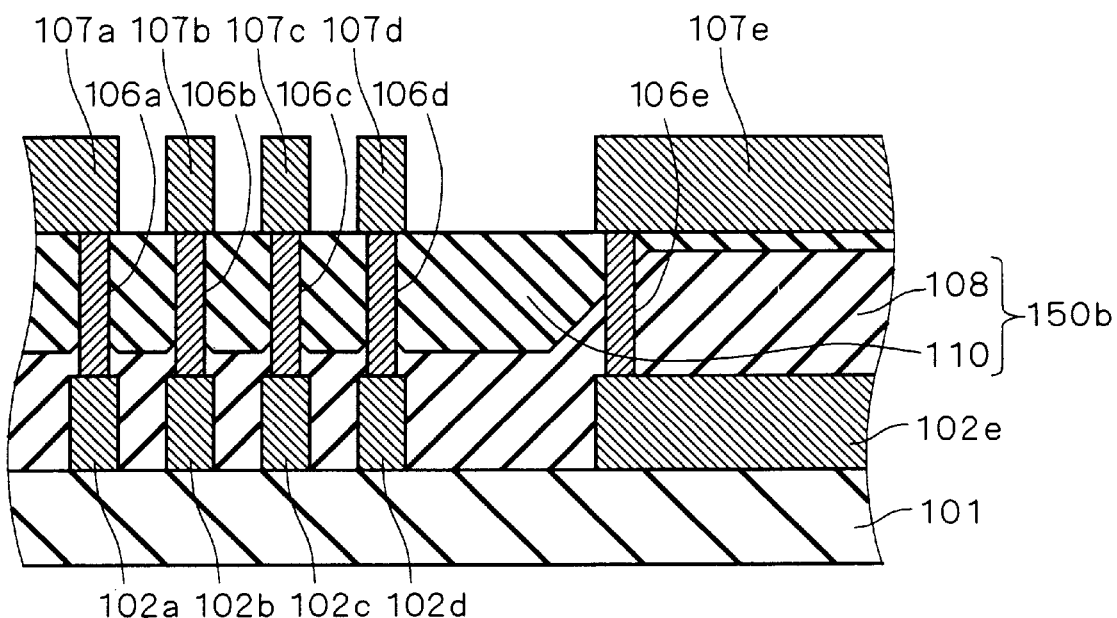
Figure 18:
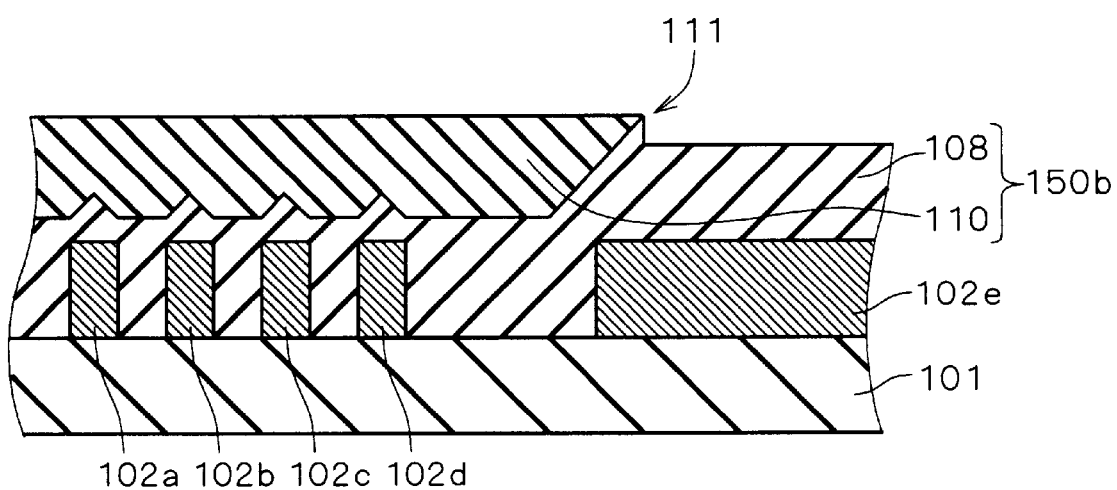
FIG. 18 is a cross section view illustrating a step difference occurring on an upper surface of an interlayer dielectric film.
Figure 19:
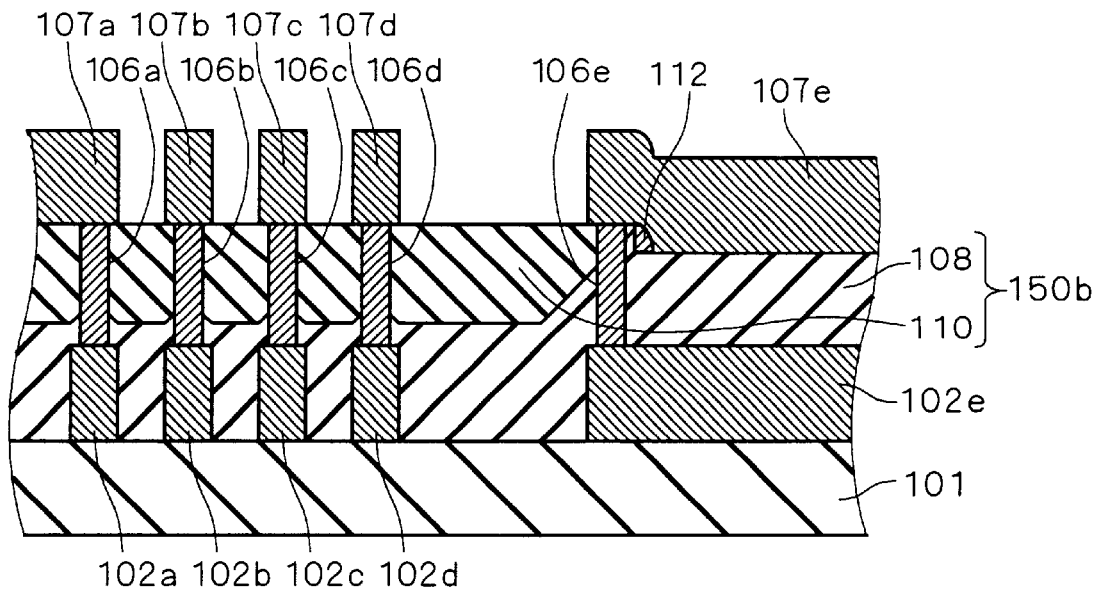
FIG. 19 is a cross section view illustrating a metal side wall formed along the step difference.
Figure 20:
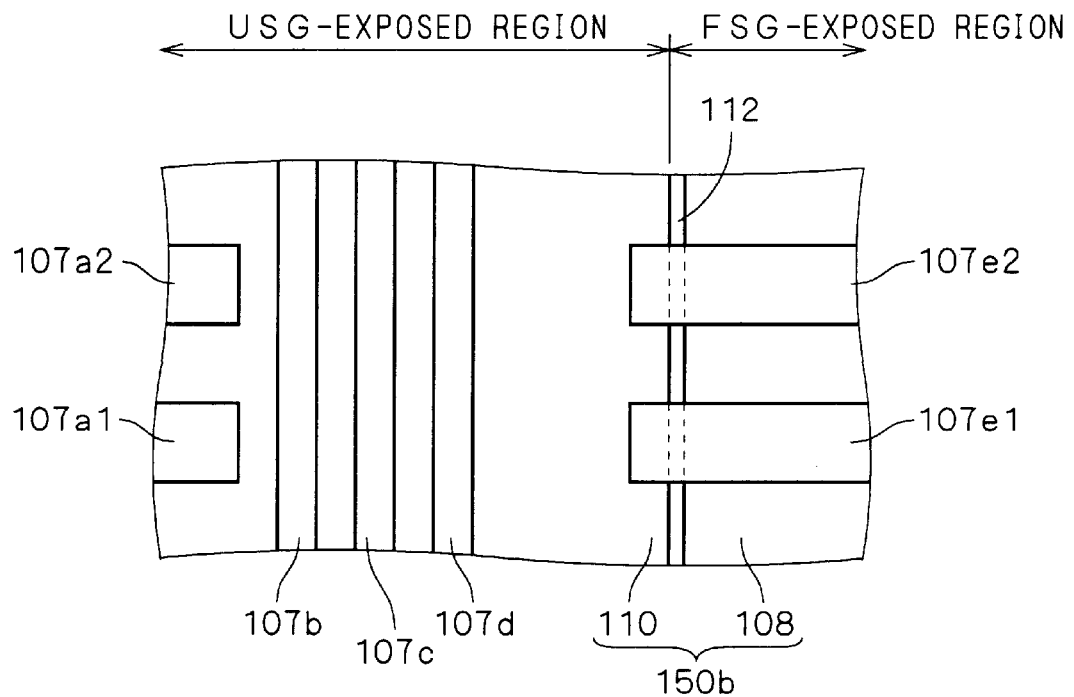
FIG. 20 is a top view illustrating the metal side wall formed along the step difference.

FIGS. 7 and 8 are cross section views illustrating steps in a method of manufacturing a semiconductor device according to a second preferred embodiment of the present invention. First, the structure illustrated in FIG. 5 is obtained through the production steps similar to those of the aforementioned first preferred embodiment. Next, the surface of the interlayer dielectric film 50 is cleaned with the use of a cleaning liquid whose etching rate to the FSG film 3 and etching rate to the USG film 5 are substantially the same, in the same manner as in the aforementioned first preferred embodiment.

Then, a USG film 8 is deposited to a thickness of 100 nm over the entire surface of the interlayer dielectric film 50 by the CVD method or the like. This completes a new interlayer dielectric film 51 made of the interlayer dielectric film 50 and the USG film 8 (FIG. 7).

Next, a plurality of contact holes 6a to 6e, which are respectively in contact with the wirings 2a to 2e and filled with a conductor plug, are formed in the interlayer dielectric film 51. Then, a plurality of wirings 7a to 7e are formed on the interlayer dielectric film 51 by a method similar to the one used in the aforementioned first preferred embodiment (FIG. 8).

Thus, for manufacturing a semiconductor device according to the second preferred embodiment of the present invention, the USG film 8 is formed over the entire surface of the interlayer dielectric film 50 to form the interlayer dielectric film 51. Therefore, even if a part of the upper surface of the FSG film 3 is exposed in the upper surface of the interlayer dielectric film 50 by variations in a production step, the close adhesion between the interlayer dielectric film 51 and the wirings 7a to 7e can be enhanced because the exposed upper surface of the FSG film 3 is covered with the USG film 8, and the wirings 7a to 7e are formed on the USG film 8.

Third Preferred Embodiment

Hereafter, a method of manufacturing a semiconductor device according to a third preferred embodiment of the present invention will be described. First, the structure illustrated in FIG. 5 is obtained through the production steps similar to those of the aforementioned first preferred embodiment. Next, the surface of the interlayer dielectric film 50 is cleaned with the use of a cleaning liquid whose etching rate to the FSG film 3 and etching rate to the USG film 5 are substantially the same, in the same manner as in the aforementioned first preferred embodiment.

Then, a heat treatment is carried out at 300° C. in a nitrogen atmosphere. This eliminates the moisture, which is absorbed by the FSG film 3 in the previous steps such as the CMP step and the cleaning step, from the FSG film 3. Thereafter, in the same manner as in the aforementioned first preferred embodiment, contact holes 6a to 6e are formed in the interlayer dielectric film 50, followed by forming wirings 7a to 7e on the interlayer dielectric film 50.

Thus, for manufacturing a semiconductor device according to the third preferred embodiment of the present invention, the predetermined heat treatment is carried out after the step of cleaning the interlayer dielectric film 50 and before the step of forming the wirings 7a to 7e. Therefore, even if a part of the upper surface of the FSG film 3 is exposed in the upper surface of the interlayer dielectric film 50 by variations in a production step, the moisture absorbed by the FSG film 3 can be eliminated from the FSG film 3 by the heat treatment, thereby evading the problem of decrease in the close adhesion between the interlayer dielectric film 50 and the wirings 7a to 7e, which decrease is caused by such moisture.

Here, in the above descriptions, the invention according to the third preferred embodiment has been applied on the basis of the method of manufacturing a semiconductor device according to the aforementioned first preferred embodiment. However, the invention according to the third preferred embodiment can also be applied on the basis of the method of manufacturing a semiconductor device according to the aforementioned second preferred embodiment. More specifically described, a heat treatment is carried out at 300° C. in a nitrogen atmosphere after the step of cleaning the interlayer dielectric film 50 and before the step of forming the USG film 8. Therefore, even if a part of the upper surface of the FSG film 3 is exposed in the upper surface of the interlayer dielectric film 50 by variations in a production step, the moisture absorbed by the FSG film 3 can be eliminated from the FSG film 3 by the heat treatment, thereby evading the problem of decrease in the close adhesion between the USG film 8 and the wirings 7a to 7e, which decrease is caused by such moisture of the FSG film 3 being transferred to the USG film 8. As a result, the close adhesion between the wirings 7a to 7e and the interlayer dielectric film 51 can be further enhanced.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor device comprising:

an underlying layer;

a first layer wiring formed on said underlying layer;

an interlayer dielectric film formed on said underlying layer to cover said first layer wiring; and a second layer wiring formed on said interlayer dielectric film, said interlayer dielectric film comprising:
   a first dielectric film formed on said underlying layer to cover said first layer wiring; and
   a second dielectric film formed on said first dielectric film, said second dielectric film being made of a different material from said first dielectric film, said second dielectric film having a thickness reduced by a predetermined thickness from a surface thereof after being formed once,
   wherein said interlayer dielectric film has a surface made flat by being cleaned with a cleaning liquid whose etching rate to said first dielectric film and etching rate to said second dielectric film are substantially the same.

2. A semiconductor device according to claim 1, wherein said first dielectric film is a dielectric film made of a material having a lower electric permittivity than said second dielectric film; and said second dielectric film is a dielectric film made of a material having a lower moisture absorptivity than said first dielectric film.

3. A semiconductor device according to claim 1, wherein said first dielectric film is a silicon oxide film containing fluorine;

said second dielectric film is a silicon oxide film containing no fluorine; and said cleaning liquid is any one of ammonia hydrogen peroxide mixture, TMAH (tetramethylammonium hydride), and EDTA (ethylenediaminetetraacetic acid).

4. A semiconductor device according to claim 1, further comprising
   a third dielectric film formed on said surface of said interlayer dielectric film, said third dielectric film being made of a material having a lower moisture absorptivity than said first dielectric film.

5. A semiconductor device according to claim 1, wherein said first layer wiring and said second layer wiring are metal wirings.

6. A semiconductor device according to claim 1, wherein a part of an upper surface of said first dielectric film is exposed in said surface of said interlayer dielectric film.

* * * * *